US008357939B2

(12) United States Patent
Nakai

(10) Patent No.: US 8,357,939 B2
(45) Date of Patent: Jan. 22, 2013

(54) SILICON WAFER AND PRODUCTION METHOD THEREFOR

(75) Inventor: Katsuhiko Nakai, Yamaguchi (JP)

(73) Assignee: Siltronic AG, Munich (DE)

( * ) Notice: Subject to any disclaimer, the term of this patent is extended or adjusted under 35 U.S.C. 154(b) by 98 days.

(21) Appl. No.: 12/956,160

(22) Filed: Nov. 30, 2010

(65) Prior Publication Data

US 2011/0156215 A1   Jun. 30, 2011

(30) Foreign Application Priority Data

Dec. 29, 2009   (JP) ................. 2009-299162

(51) Int. Cl.
*H01L 29/04* (2006.01)
*H01L 21/322* (2006.01)
*H01L 21/84* (2006.01)

(52) U.S. Cl. ............... 257/64; 438/166; 438/473
(58) Field of Classification Search .......... 438/473–475, 438/150, 166; 257/62–67
See application file for complete search history.

(56) References Cited

U.S. PATENT DOCUMENTS

| 4,851,358 A | 7/1989 | Huber |
| 6,222,252 B1 | 4/2001 | Numano et al. |
| 8,142,885 B2 * | 3/2012 | Nakai et al. ............... 428/220 |
| 2010/0047563 A1 * | 2/2010 | Nakai et al. ............... 428/332 |
| 2010/0155903 A1 * | 6/2010 | Ishisaka et al. .......... 257/617 |
| 2010/0163807 A1 * | 7/2010 | Fukuda et al. ............ 252/500 |

FOREIGN PATENT DOCUMENTS

| EP | 0060676 A2 | 9/1982 |
| EP | 0502471 A2 | 9/1992 |
| EP | 1229155 A1 | 7/2002 |
| EP | 1406294 A1 | 4/2004 |
| EP | 1928016 | * 11/2007 |
| EP | 2144280 A1 | 1/2010 |
| JP | 58056343 A | 4/1983 |
| JP | 08213403 A | 8/1986 |
| JP | 2006040980 A | 2/2006 |
| JP | 2008160069 A | 7/2008 |
| JP | 2008166721 A | 7/2008 |
| JP | 2009164155 A | 7/2009 |
| KR | 2009-0129443 | 12/2009 |
| WO | 9320582 | 10/1993 |
| WO | 03060982 A2 | 7/2003 |

OTHER PUBLICATIONS

Seigo Kishino et al., "A Defect Control Technique for the Intrinsic Gettering in Silicon Device Processing", Japanese Journal of Applied Physics, Japan, vol. 23, Jan. 31, 1984, pp. L9-L11, XP008133530.

(Continued)

*Primary Examiner* — Calvin Lee
(74) *Attorney, Agent, or Firm* — Brooks Kushman P.C.

(57) ABSTRACT

A silicon wafer includes BMDs with a diagonal length of from 10 nm to 50 nm, and has a density of BMD which exists at a depth of 50 μm and deeper from the surface of the silicon wafer which is greater than or equal to $1 \times 10^{11}/cm^3$, and a ratio of the {111} plane of the BMD to the total planes surrounding the BMD, as an indication of the morphology of the BMD, is less than or equal to 0.3.

2 Claims, 9 Drawing Sheets

OTHER PUBLICATIONS

Fumio Shimura: "Semiconductor Silicon Crystal Technology, Passage", Semiconductor Silicon Crystal Technology, XX, XX, Jan. 1, 1989, pp. 361-367 (XP 002307370, p. 364-p. 365; figure 7.68 (b).

P. Fraundorf et al., "Clustering of Oxygen Atoms Around Carbon and Silicon," J. Appl. Phys., vol. 58, No. 11, Dec. 1, 1985, pp. 4049-4055, XP002624639, Figure 2, Table 1.

Fumio Shimura, "Redissolution of Precipitated Oxygen in Czoczralski-Grown Silicon Wafers," Applied Physics Letters, AIP, American Institute of Physics, Melville, NY, U.S. vol. 39, No. 12, Dec. 15, 1981, pp. 987-989, XP000817122, ISSN: 0003-6951, DOI:DOI:10.1063/1.92636.

Shimura et al., "Multistep Repeated Annealing for CZ-Silicon Wafers: Oxygen and Induced Defect Behavior", Journal of the Electrochemical Society, Electrochemical Society, Manchester, New Hampshire, U.S. vol. 129, No. 9, Sep. 1, 1982, pp. 2089-2095, XP000840676, ISSN: 0013-4651, Figure 1.

W. Zulehner et al., "Czochralski-Grown Silicon", Properties and Applications, p. 28, Springer Verlag, New York, 1982.

* cited by examiner

SILICON WAFER AND PRODUCTION METHOD THEREFOR

CROSS-REFERENCE TO RELATED APPLICATION

This application claims priority to Japanese Patent Application No. JP 2009-299162 filed Dec. 29, 2009 which is herein incorporated by reference.

BACKGROUND OF THE INVENTION

1. Field of the Invention

The present invention relates to a silicon wafer and production technology therefor which is capable of suppressing generation of both slip dislocations and warpage, in a field of production technology of semiconductor wafers, in particular, device production processes.

2. Background Art

Silicon wafers to be used as a substrate for producing semiconductor devices are produced by slicing a single crystal silicon ingot, and performing heat treatment or mirror finishing or the like. Due to the ease of obtaining single crystal ingots having a large diameter, or in controlling defects, most single crystal silicon ingots are produced by a Czochralski ("CZ") method. A silicon single crystal silicon grown by such a CZ method ("CZ-Si") has internal "Grown-in defects," in particular, supersaturated oxygen taken into the silicon lattice in a supersaturated state, which causes formation of micro defects known as Bulk Micro Defects ("BMD"), during a subsequent heat treatment (anneal).

In general, BMDs existing inside a crystal just after single crystal silicon growth (Grown-in defect, an oxygen deposit, dislocation, lamination defect or the like induced in a device production process) deteriorates device characteristics, and therefore it is required that there are no crystal defects in a formation region of a semiconductor device. However, on the other hand, it has also been revealed that BMDs can be utilized effectively as a gettering site for heavy metals or to increase the mechanical strength of the substrate, and thus at present, generation of a suitable amount of BMDs inside a silicon wafer is required.

In order to satisfy such requirements, there is generally used at present a method for forming an Intrinsic Gettering layer (hereafter referred to as "an" IG layer") by annealing the silicon wafer at high temperature and inducing BMD formation inside the silicon wafer, as well as forming a Denuded Zone layer (hereafter referred to as a "DZ layer") having extremely low crystal defects by eliminating grown-in defects near the surface of the silicon wafer.

However, the DZ layer formed on the front and rear surfaces of the silicon wafer by the annealing process at high temperature decreases the number of BMDs or dislocations, which together with oxygen or oxygen impurities or the like, results in an extreme decrease of oxygen concentration by outward diffusion of oxygen during heat treatment, and in turn extremely decreases suppression of the extension of dislocation defects at the front and rear surfaces of the silicon wafer. Therefore, dislocation defects (hereafter referred to as "slip") easily extend into the bulk from minute flaws on the front and rear surfaces, introduced in the annealing step, creating the problem that the strength of the silicon wafer decreases due to extension of such slip dislocations. Furthermore, such decrease of silicon wafer strength can result in wafer damage or wafer destruction during production steps. However, the DZ layer is indispensible in semiconductor device formation, therefore, silicon wafers which have a DZ layer and yet exhibit excellent strength properties are desired. In particular, when annealing is performed on a wafer supported by a heat treatment susceptor or the like, a slip dislocation often extends from the part supported by the susceptor, because of a dislocation generated at the contact point of the silicon wafer and the susceptor. In addition, a slip dislocation may extend from the edge part of the silicon wafer.

In addition, in order to produce a device such as once having a thermally oxidized film, or activation of a dopant injected into a source or drain region, heat treatment of the silicon wafer is essential. In general, heat treatment is classified as: batch heat treatment, where one treatment is performed by assembling longitudinally several tens to hundreds or more of wafers held horizontally; and single wafer heat treatment, where heat treatment is performed wafer by wafer. In heat treatment, generation of a temperature gradient on the silicon wafer surface causes thermal stress on the surface in proportion to the gradient, and a thermal stress of over a certain value raises a problem of not only minute level differences on the wafer surface, or the slip previously mentioned, but also causes warpage of the silicon wafer.

Technologies to suppress and prevent the generation of such slip dislocation or warpage are known. For example, in JP-A-2008-166721, there is disclosed a technology to produce a silicon wafer, in which a predetermined amount of plate-like BMDs are formed and an inter-lattice oxygen concentration is less than or equal to $5 \times 10^{17}$ atoms/cm$^3$, by performing heat treatment at a temperature range of 600 to 750° C. for 10 minutes to 10 hours, and then increasing the temperature up to 1000° C. at a rate of 0.1° C./minute to 1° C./minute for 5 to 50 hours, and further subjecting the silicon wafer to heat treatment at a temperature range of 1000 to 1250° C. so that the diffusion length of inter-lattice oxygen is below 20 to 30 μm.

In addition, in JP-A-2008-160069, there is disclosed a technology to produce a silicon wafer, in which a predetermined amount of octahedral BMDs are formed and an inter-lattice oxygen concentration is less than or equal to $5 \times 10^{17}$ atoms/cm$^3$, by performing heat treatment at a temperature range of 600 to 750° C. for 30 minutes to 10 hours, and then the increasing the temperature up to 1000° C. at a rate of 0.1 to 1° C./minute for 5 hours to 50 hours, and by further subjecting the silicon wafer to heat treatment at a temperature range of 1000 to 1250° C. so that the diffusion length of inter-lattice oxygen is 30 μm to 50 μm.

Further, in JP-A-2009-164155, there has been disclosed a technology to control the change of substitution-type carbon concentration and inter-lattice oxygen concentration inside a silicon wafer to be within a predetermined range before and after heat treatment in a heat treatment furnace by a low temperature heat treatment of 650 to 800° C., thereafter setting a maximal temperature at 700 to 1000° C. and increasing the temperature at a rate of 0.1 to 2° C./minute; removing the silicon wafer at 600° C. to 800° C.; further inserting the silicon substrate inside a heat treatment furnace at a furnace temperature of 600 to 800° C.; increasing the temperature of the heat treatment furnace at a rate of 5 to 10° C./minute in a temperature range from the insertion temperature up to below 1100° C.; increasing the temperature of the heat treatment furnace at a rate of 1 to 2° C./minute in a temperature range of 1100 to 1250° C.; and keeping the temperature of the heat treatment furnace constant within the range of 1000° C. to 1250° C.; thus performing a heat treatment at a high temperature of 1100 to 1250° C.

FIG. 1 shows a schematic diagram of a typical example of slip and warpage introduced by heat treatment. The slip is introduced from a contact point of the rear surface of the wafer and a wafer holding member or from the edge of the wafer. The introduced slip extends in a 110 direction and incurs wafer damage or destruction depending on the case. The warpage is a phenomenon that the wafer deforms due to thermal strain in heat treatment. For example, a wafer of the 100 plane, as shown in FIG. 1, may exhibit concave-type warpage. Usually, warpage of the silicon wafer, before heat treatment is performed to bring desired characteristics, is less than or equal to 10 μm. However, the heat applied by heat treatment may generate a concave-convex height difference of the silicon wafer that reaches several tens of μm. Increased warpage disturbs correct exposure of a semiconductor device pattern on the wafer surface, and causes decreased yield of the semiconductor device.

The warpage problem tends to be significant when the wafer diameter is greater than or equal to 200 mm, and is also significant when the heat treatment step of the device is performed at high temperature over a long time. On the other hand slip dislocation decreases when the BMD concentration increases, and warpage increases when the BMD concentration increases. Thus, it is known that slip and warpage are in a trade-off relationship. Accordingly, there still is a problem that generation of slip and warpage, in particular, generation of warpage, cannot be suppressed and prevented effectively. The total density of BMDs inside the silicon wafer can only be increased to a high concentration by the technology as disclosed in JP-A-2008-166721 and JP-A-2008-160069, in which the concentration of relatively large BMDs is decreased to suppress and prevent generation of warpage, the density of relatively small BMDs is increased to suppress and prevent generation of slip or slip length, and further, BMD shape is controlled to a predetermined morphology such as plate or octahedron to suppress and prevent generation of slip or slip length, so as to adjust inter-lattice oxygen concentration and then to secure oxygen adhered to BMD to the predetermined amount.

In addition, there is a problem that warpage cannot be suppressed and prevented effectively by the method as disclosed in JP-A-2009-164155, by the number of oxygen or carbon atoms adhered to BMDs by performing heat treatment so as to maintain carbon concentration and oxygen concentration in the silicon wafer as much as possible before and after heat treatment to the predetermined amount, although generation of slip or slip length can be suppressed to some extent.

SUMMARY OF THE INVENTION

Therefore, a problem to be solved by the present invention is to provide a silicon wafer which is capable of suppressing generation of both slip dislocation and warpage during a device production process, and to a production technology therefor. In view of the above problems, as a result of intensive study by the present inventors, the silicon wafers of the present invention have BMDs with a diagonal length of 10 nm to 50 nm, wherein the density of the BMDs which exist at a position of depth equal to or deeper than 50 μm from the surface of the silicon wafer is greater than or equal to $1 \times 10^{11}/cm^3$, and a ratio of the {111} plane to total planes surrounding the BMDs, as morphology of the BMDs, is less than or equal to 0.3.

These and other objects are achieved by a method for producing a silicon wafer comprising the steps of: subjecting a silicon substrate wafer obtained by cutting from a silicon crystal to the following heat treatment step (A), heat treatment step (B) and heat treatment step (C):

(A) the heat treatment step (A) comprising the steps of: inserting the silicon substrate wafer into a heat treatment furnace by setting the furnace temperature at 700° C. to 800° C.; increasing the temperature at a rate of 5° C./minute to 10° C./minute from the range of the insertion temperature of the silicon substrate wafer to a temperature of below 1100° C.; increasing the temperature at a rate of 1° C./minute to 2° C./minute to a temperature range of 1100° C. to 1250° C.; keeping the temperature constant at 1200° C. to 1250° C. for 2 to 4 hours; decreasing the temperature of the heat treatment furnace at a rate of 1° C./minute to 10° C./minute; removing the silicon substrate wafer from the heat treatment furnace at a temperature of 700° C. to 800°; and cooling the silicon substrate wafer down to room temperature;

(B) the heat treatment step (B) comprising the steps of: inserting the silicon substrate wafer into a heat treatment furnace by setting the furnace temperature at 700° C. to 800° C.; performing a heat treatment at a constant temperature of 700° C. to 800° C. for from 30 minutes to 5 hours; increasing the temperature at a rate of 0.5° C./minute to 2° C./minute, up to a temperature in which +50° C. or more is added to the constant temperature; decreasing the temperature of the heat treatment furnace at a rate of 1° C./minute to 10° C./minute; removing the silicon substrate wafer from the furnace at a temperature of 700° C. to 800° C.; and cooling the substrate down to room temperature; and (C) the heat treatment step (C) comprising the steps of inserting the silicon substrate wafer into a heat treatment furnace by setting the furnace temperature at 700° C. to 800° C.; increasing the temperature at a rate of 5° C./minute to 10° C./minute for a range from the insertion temperature of the silicon substrate wafer to a temperature of below 1100° C.; increasing the temperature at a rate of 1° C./minute to 2° C./minute to a temperature range of 1100° C. to 1250° C.; keeping the temperature constant at 1200° C. to 1250° C. for 1 to 4 hours; decreasing the temperature of the heat treatment furnace at a rate of 1° C./minute to 10° C./minute; and removing the silicon substrate wafer from the heat treatment furnace at a temperature of from 700° C. to 800° C.

DETAILED DESCRIPTION OF THE PREFERRED EMBODIMENTS

Figure 1:
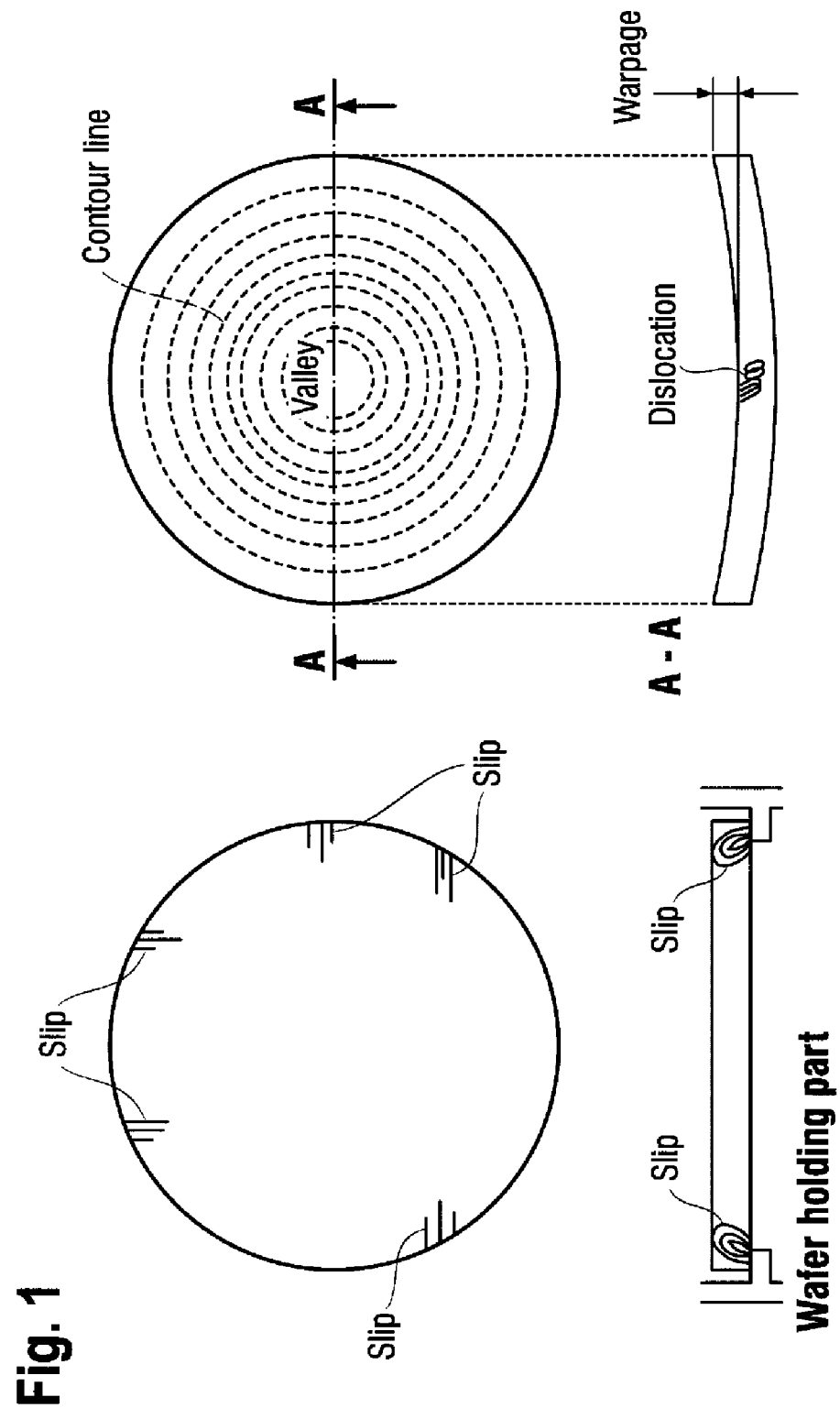
FIG. 1 is a drawing explaining slip and warpage caused by heat treatment of a silicon wafer.

According to the present invention, by assuring that the density of BMDs existing at depth position of at least 50 μm from the surface of the silicon wafer is higher than or equal to $1\times10^{11}/cm^3$, and the ratio of the {111} plane in total planes surrounding BMD, as an indication of the morphology of the BMD, is less than or equal to 0.3, generation of both of slip and warpage during device production steps can be suppressed to an extremely small level, and production of a wafer without a decrease in strength while still having a DZ layer, and having a large diameter (typically greater than or equal to 200 mm) and high quality is possible. The silicon wafer of the present invention prevents generation of slip dislocations and has higher gettering capability than a mirror wafer not having BMDs inside the wafer.

A first aspect of the present invention is a silicon wafer having BMDs with a diagonal length of 10 nm to 50 nm, wherein the density of the BMDs at positions equal to or deeper than 50 μm from the surface of the silicon wafer is greater than or equal to $1\times10^{11}/cm^3$, and a ratio of the {111} plane in total planes surrounding BMD is less than or equal to 0.3.

Thereby, the present invention provides a silicon wafer which is capable of suppressing and preventing generation of both slip and warpage to an extremely low level in a device production processes. That is, BMDs which exist at positions equal to or deeper than 50 μm from the surface of the silicon wafer of the present invention positively influence the characteristics of slip or warpage; and further, among the influences, the slip suppression effect of BMDs having a diagonal length of equal to or longer than 10 nm is large, and in the silicon wafer formed with BMDs of a high density of higher than or equal to $1\times10^{11}/cm^3$, generation of slip is suppressed to extremely low (typically equal to or lower than 10 mm) in a general device production process. In addition, even in the case where slip is generated from a wafer support part in the device production process, the invention can prevent the slip from going through the surface of the silicon wafer, or even in the case where slip generated at the wafer edge, extension of the slip to a region of semiconductor device formation can be prevented, and thus adverse influence on the device can be prevented.

Size (diameter, thickness) of the wafer attained by the present invention, and presence or absence of doping by various elements are not particularly limited, and these features can be selected, as appropriate, corresponding to the kind of semiconductor silicon wafer required. Further, there is also no especial limitation on semiconductor devices produced by using the silicon wafer of the present invention, and it is thus applicable to production of a variety of semiconductor devices. Specifically, the silicon wafer of the present invention is eminently suitable for production of wafers with an epitaxial layer on the surface ("epitaxial wafers"), laminated SOI wafers, SIMOX wafers produced by the SIMOX process (Separation By Implanted Oxygen), or SiGe wafers formed with an SiGe layer on the surface, and the like.

The silicon wafer of the present invention has BMDs with a diagonal length of 10 nm to 50 nm, at positions equal to or than 50 μm from the surface thereof, and preferably has BMDs with a diagonal length of 20 nm to 50 nm at positions equal to or than 50 μm from the surface thereof.

It is estimated that when the diagonal length of BMDs is 10 nm to 50 nm, a slip suppression effect is exerted, because of strong barrier effect on slip propagation. In addition, in such a range, the longer diagonal length and the higher density provide a higher effect of slip suppression, and thus this is preferable.

Figure 2:
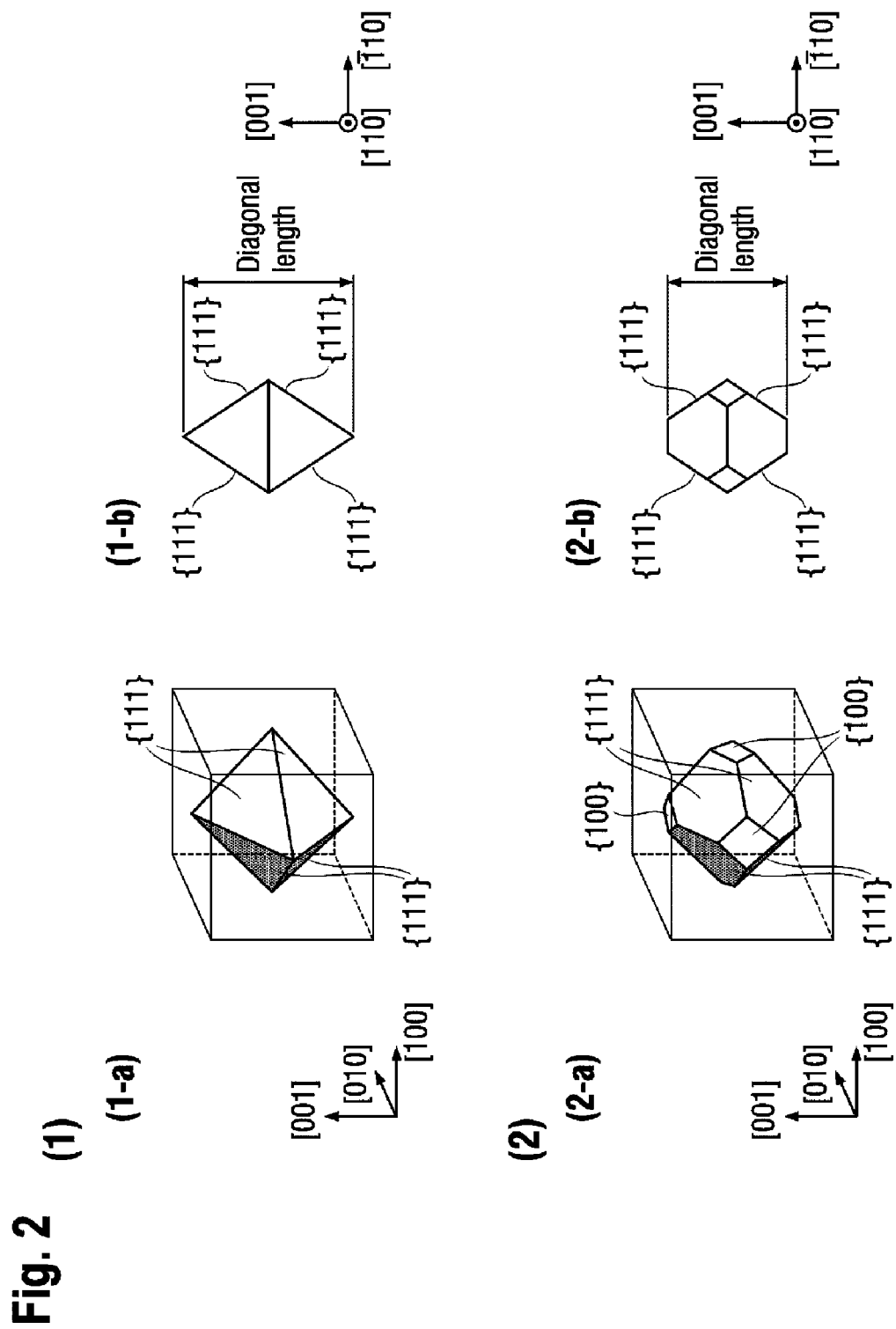
FIG. 2 is a drawing showing the relationship between BMD shape and diagonal length of BMDs.

"Diagonal length of BMD" in the present description means length in a <100> direction, in a plane image of BMD projected orthogonally to any one of the {110} planes. For example, diagonal length of an octahedral BMD shown in FIG. 2(1) (1-a) is length in a [001] axis direction among FIG. 2(1) (1-b), which is an plan view projected orthogonally to the (110) plane; and diagonal length of an dodecahedral BMD, shown in FIG. 2(2) (2-a), is length in a [001] axis direction among FIG. 2(2) (2-b), which is an image projected orthogonally to the (110) plane. Similarly as above, FIGS. 3(1) (1-a) and (1-b) show shape of an irregular BMD, and diagonal length thereof, respectively, and FIGS. 3(2) (2-a) and (2-b) show shape of a partially irregular BMD, and diagonal length thereof, respectively. Diagonal length of BMD is a parameter relating to the size of the BMD.

Density of BMDs existing at depth position equal to or deeper than 50 μm from the surface of the silicon wafer of the present invention, is greater than or equal to $1\times10^{11}/cm^3$, and it is preferably from $1\times10^{12}/cm^3$ to $1\times10^{13}/cm^3$. A density of the relevant BMDs below $1\times10^{11}/cm^3$ makes the slip suppression effect insufficient, and formation of BMD with a density of over $1\times10^{13}/cm^3$ is generally difficult due to the following reason, as discussed below.

Solid solution oxygen included in general growth condition of a CZ single crystal is about $1\times10^{18}$ atoms/$cm^3$, and in a state that BMDs are formed in a high density of higher than or equal to $1\times10^{11}/cm^3$, almost all of the oxygen atoms attain a deposited state. Because there is an upper limit of the solid solution oxygen, it is generally difficult to form BMDs having a diagonal length of equal to or longer than 10 nm at a density of over $1\times10^{13}/cm^3$, and it is also difficult generally to make the size of BMDs having a density of greater than or equal to $1\times10^{11}/cm^3$ to be over 50 nm.

In BMDs existing in the silicon wafer of the present invention, the ratio of the {111} plane in total planes surrounding BMD, as an indication of morphology of the BMDs, is less than or equal to 0.3, and more preferably, the ratio of the {111} plane is less than or equal to 0.1.

"Ratio of the {111} plane in total planes surrounding BMD" in the present description means: in a plane image of BMD projected orthogonally to any one of the {110} planes, (total length of vertical side to a <111> direction, that is, orthogonal projection of the {111} plane)/(total of circumference length). For example, in FIG. 7(a), which is a plan view where an octahedron-shaped BMD is orthogonally projected to the (110) plane, because BMD circumference is all a side vertical to the <111> direction, the ratio of the {111} plane is 1; and in FIG. 7(b), which is a plan view where a dodecahedral BMD is orthogonally projected to the (110) plane, because side b and side e are vertical to the [−111] direction, and side c and side f are vertical to the [−11−1] direction, the ratio of the {111} plane is (b+c+e+f)/(a+b+c+d+e+t). In FIG. 7(c), because side b is vertical to the [−11−1] direction, ratio of the {111} plane is b/(length of arc a+b); and because the clear [111] plane is not observed in FIG. 7(d), the ratio of the {111} plane is 0.

Figure 5:
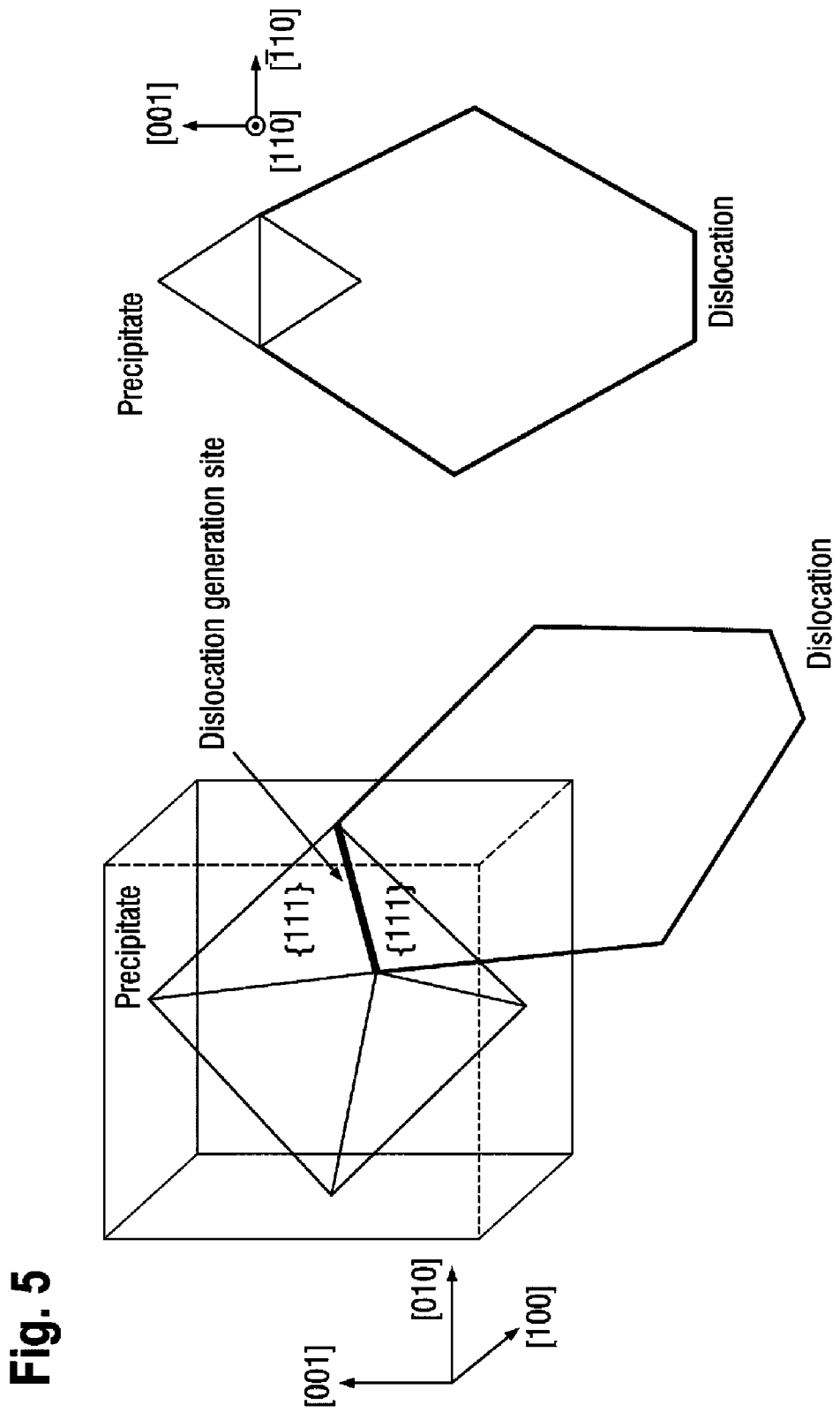
FIG. 5 is a drawing explaining generation of dislocations at BMDs.

The present inventors have found that the cause of warpage of the silicon wafer by heat treatment is the generation of dislocations by BMDs formed in a high density of higher than or equal to $1\times10^{11}/cm^3$. Furthermore, by investigation of the dislocation generation mechanism by the BMDs, it was found that, as shown in FIG. 5, a region where the two {111} planes cross each other is a dislocation generation location (refer to FIG. 6). It is supposed that this region has increased strain, resulting in easy generation of dislocations.

That is, when thermal stress caused by heat treatment goes beyond a critical value, plastic deformation is generated and causes warpage of the silicon wafer. Therefore, it is considered that the presence of large dislocation generation locations where the two {111} planes cross each other, as shown in FIG. 5, causes evasive lattice defects such as dislocation inside the silicon wafer, by which the critical value of thermal stress decreases and mechanical strength of the silicon wafer after heat treatment weakens, and thus warpage is easily generated.

Figure 6:
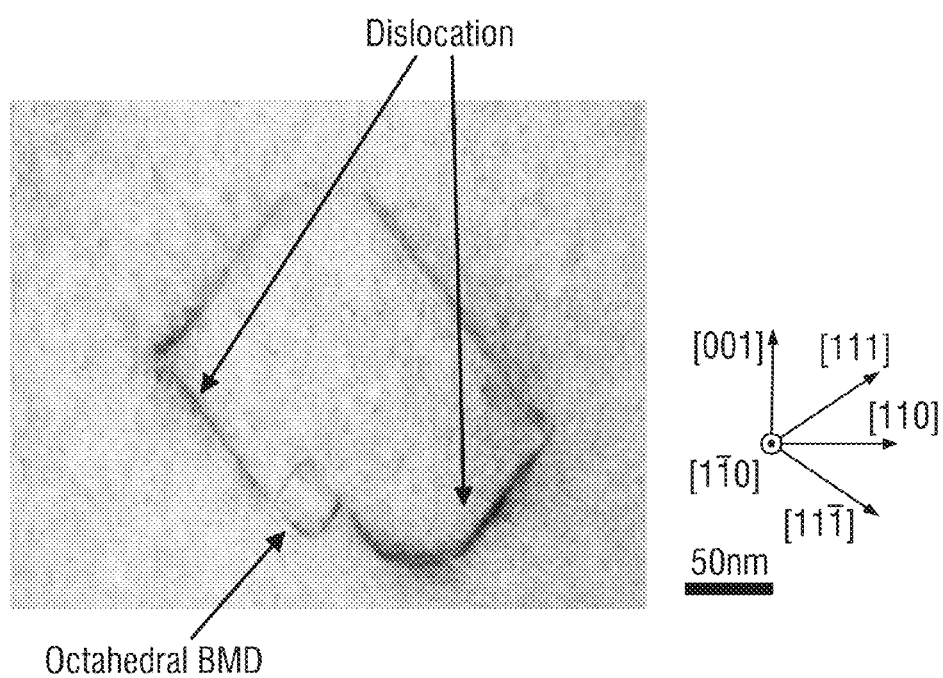
FIG. 6 is a photograph image of BMDs where dislocation has generated, by a transmission electron microscope.

FIG. 6 shows a TEM photograph image of dislocation generation location, where the two {111} planes cross. Referring to FIG. 6, because the ridge of the BMD, which is a generation location of the aforementioned dislocation, crosses with the {111} plane, it is considered that a dislocation generated at the ridge easily moves and extends in the {111} plane.

Figure 3:
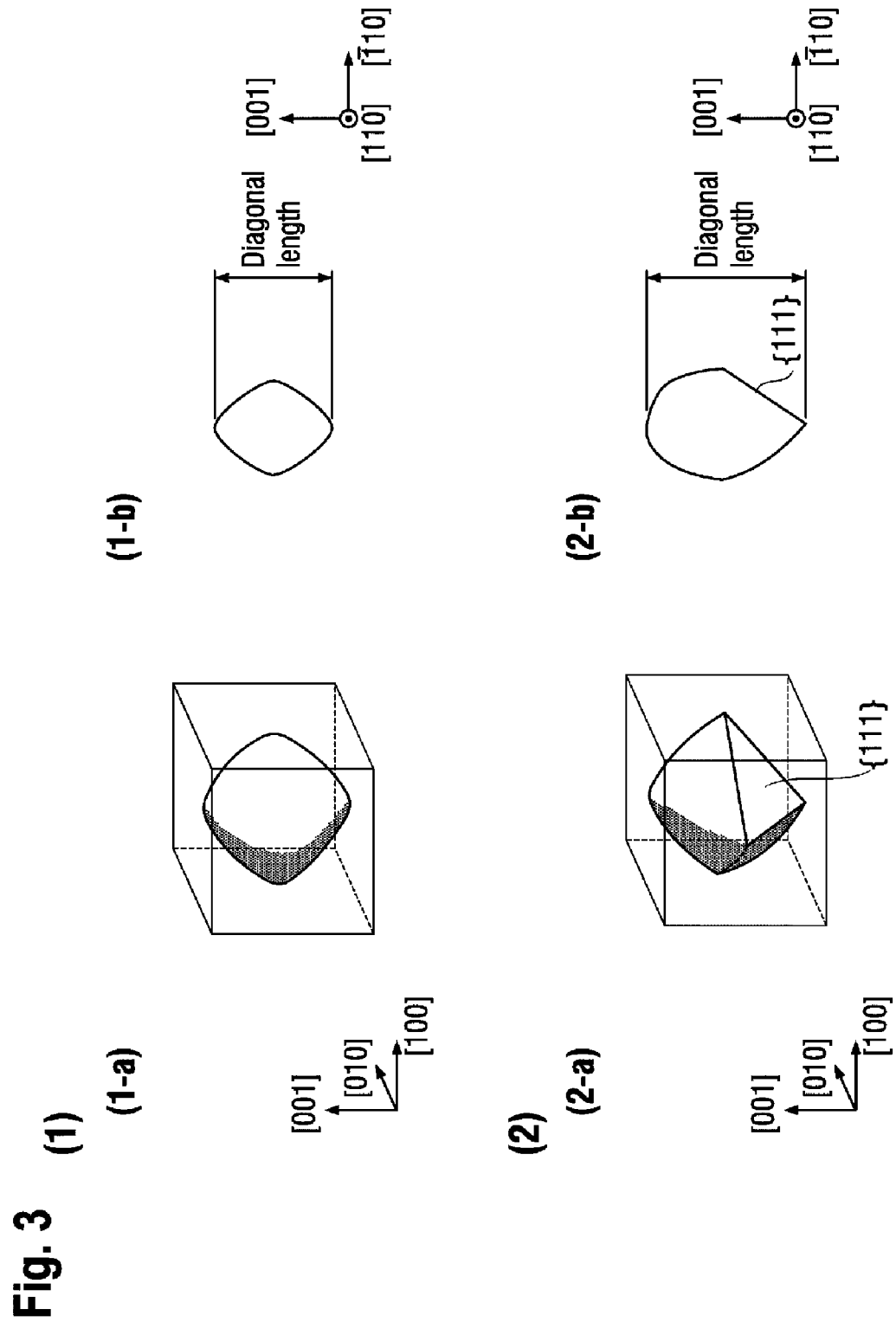
FIG. 3 is a drawing showing the relationship between BMD shape and diagonal length of BMDs.
Figure 4:
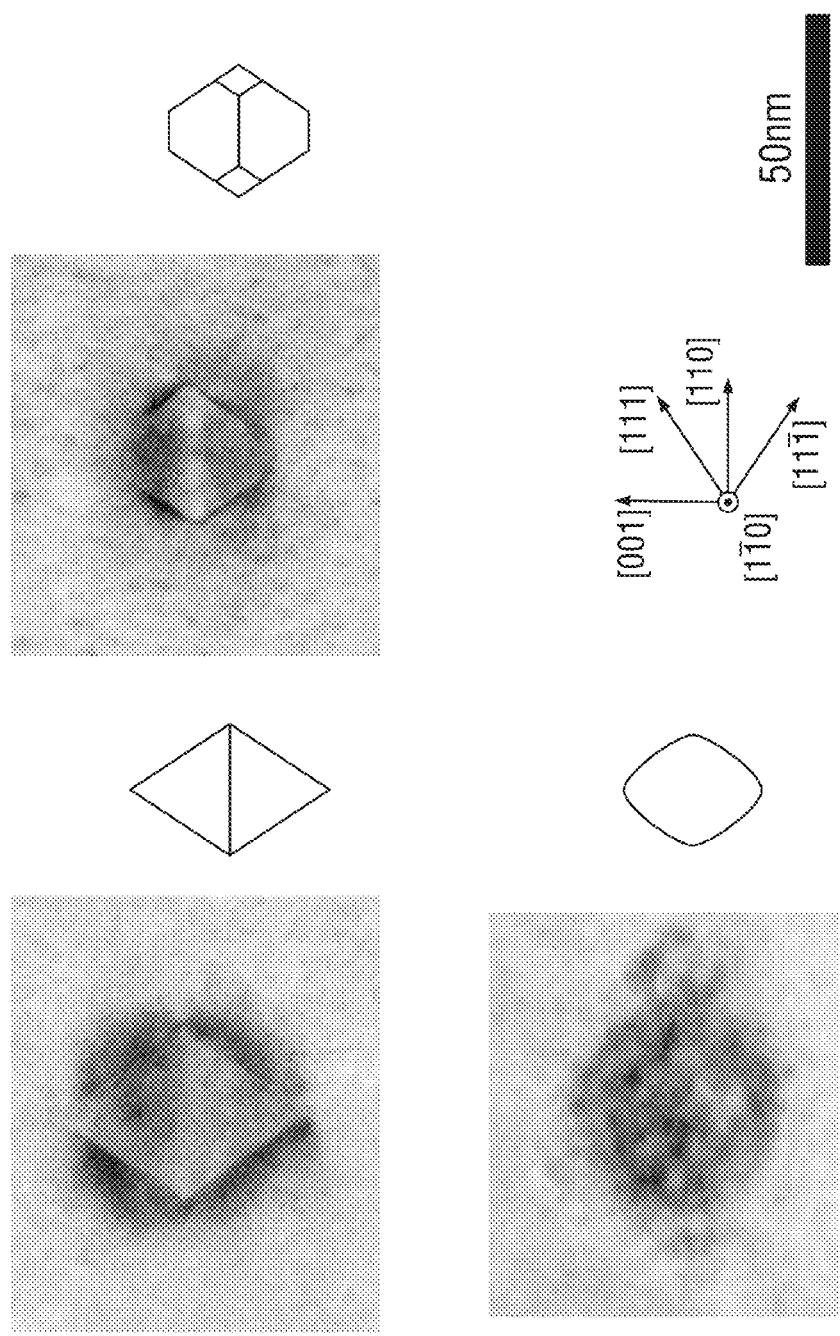
FIG. 4 is a photograph image of BMDs existing in the silicon wafer the present invention by a transmission electron microscope.

Based on the above findings, the present inventors have found that by controlling the morphology of high density BMDs formed inside the silicon wafer to be irregular BMDs having less {111} plane, as shown in FIGS. 3(1) and (2), generation of dislocation at the BMD decreases, resulting in decrease in warpage of the wafer after heat treatment. FIG. 4 shows a TEM photo of typical BMDs.

Figure 7:
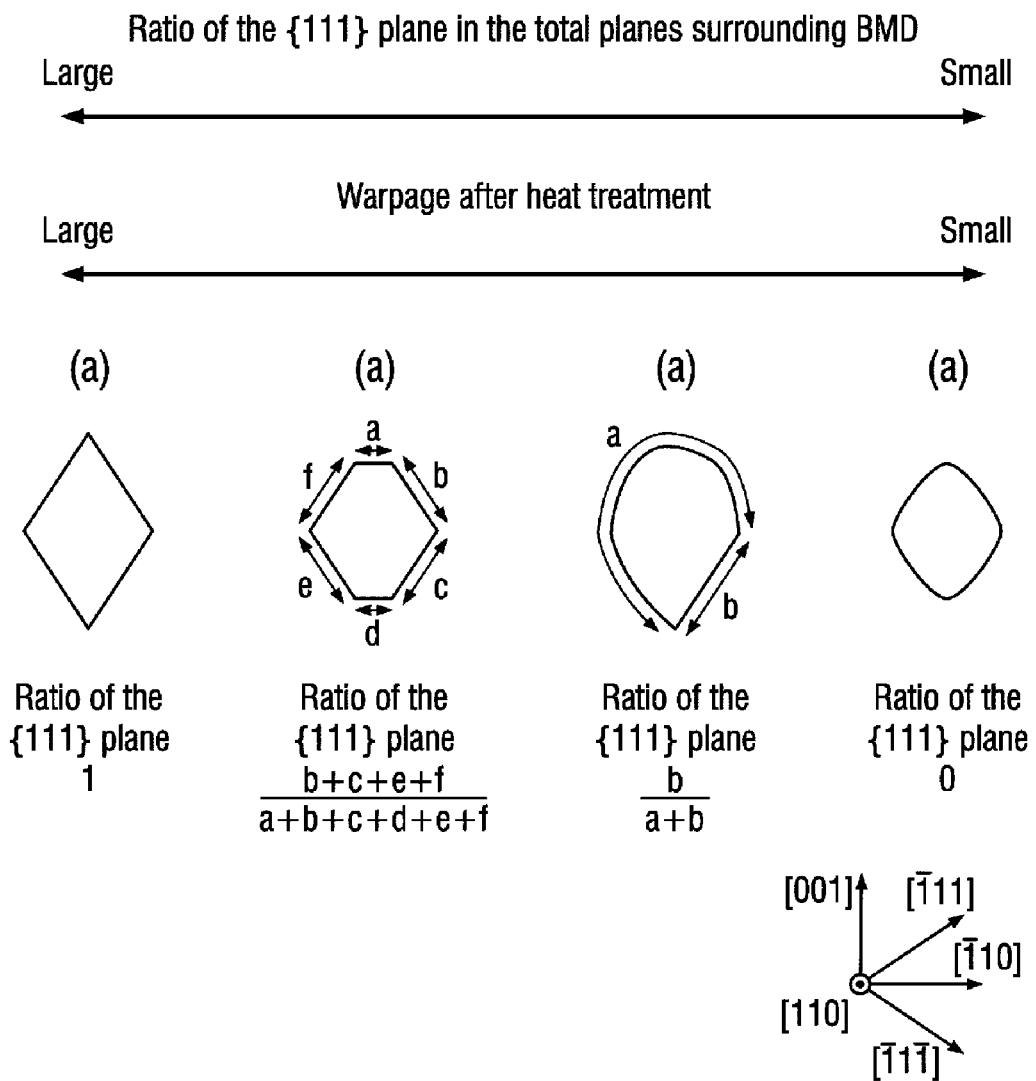
FIG. 7 is a drawing showing a calculation method for the ratio of the {111} plane.

Here, as an index of the morphology of BMD, the ratio of the {111} plane in total planes surrounding BMD is adopted. That is, as shown in FIG. 7, ratio of the length of the {111} plane to the total length of the circumference is determined, when the BMD is projected in a <110> direction. As described in detail in Examples later, according to experiments by the present inventors, it was found that warpage after heat treatment is suppressed to equal to or smaller than 10 μm when a ratio of the {111} plane becomes less than or equal to 0.3.

Based on the above results, the silicon wafer of the present invention is excellently superior in having small slip and warpage generated in device production processes. More specifically, the silicon wafer of the present invention, particularly the silicon wafer having controlled size, density and morphology of BMDs as above-described, is characterized in that the length of slip generated also in a following heat treatment is extremely short (typically, the slip is equal to or shorter than 10 mm, and increase of warpage of the wafer after heat treatment is equal to or less than 10 μm).

In order to measure the morphology, diagonal length and number of the above-described BMDs, measurement by a conventionally known method is possible. More specifically, measurement by a transmission electron microscope (hereafter referred to as "TEM") is included. The measurement method and evaluation method for slip dislocation and warpage amount of the silicon wafer of the present invention are not particularly limited. Measurement is possible by a conventionally known method: as a specific measurement method for slip dislocation in the present description, X-ray topography is used; and as a specific measurement method for warpage amount in the present description, it is possible to evaluate by observation using an FT-90A, manufactured by NIDEK Co., Ltd, or the like.

A second aspect of the present invention is a method for producing a silicon wafer, comprising the steps of subjecting a silicon substrate wafer obtained from a silicon crystal to heat treatment step (A), heat treatment step (B) and heat treatment step (C).

The heat treatment step (A) comprises the steps of: inserting the silicon substrate wafer into a heat treatment furnace set at a temperature of 700° C. to 800° C.; increasing the temperature at a rate of 5° C./minute to 10° C./minute for a range from the insertion temperature of the silicon substrate wafer to a temperature of below 1100° C.; increasing the temperature at a rate of 1° C./minute to 2° C./minute over a temperature range of from 1100° C. to 1250° C.; keeping the temperature constant between 1200° C. to 1250° C. for from 2 to 4 hours; decreasing the temperature of the heat treatment furnace at a rate of 1° C./minute to 10° C./minute; removing the silicon substrate wafer from heat treatment furnace at a temperature of 700° C. to 800°; and cooling the silicon substrate wafer down to room temperature.

The heat treatment step (B) comprises the steps of: inserting the silicon substrate wafer into a heat treatment furnace at a temperature of 700° C. to 800° C.; performing a heat treatment at a constant temperature of 700° C. to 800° C. for 30 minutes to 5 hours; increasing the temperature at a rate of 0.5° C./minute to 2° C./minute, up to a temperature in which +50° C. or more is added to the constant temperature; decreasing the temperature of the heat treatment furnace at a rate of 1° C./minute to 10° C./minute; removing the silicon substrate wafer from of the furnace at a temperature of 700° C. to 800° C.; and cooling the substrate down to room temperature.

The heat treatment step (C) comprises the steps of: inserting the silicon substrate wafer into a heat treatment furnace set at a temperature of 700° C. to 800° C.; increasing the temperature at a rate of 5° C./minute to 10° C./minute over a range of the insertion temperature of the silicon substrate wafer to a temperature of below 1100° C.; increasing the temperature at a rate of 1° C./minute to 2° C./minute within the temperature range of 1100° C. to 1250° C.; keeping the temperature constant at 1200° C. to 1250° C. for 1 to 4 hours; decreasing the temperature of the heat treatment furnace at a rate of 1° C./minute to 10° C./minute; and removing the silicon substrate wafer from the heat treatment furnace at a temperature of 700° C. to 800° C.

Thereby, it is possible to produce a silicon wafer capable of suppressing generation of both of slip and warpage in device production steps to an extremely low level, and capable of preventing the silicon wafer from decreasing in strength while still having a DZ layer, and while having a large diameter (typically greater than or equal to 200 mm) and high quality.

Hereinafter, explanation will be given on an example of the preferable production method for the silicon crystal of the present invention by reference to each of the heat treatment steps (A) to (C).

Production Method for the Silicon Crystal

The silicon crystal of the present invention is not particularly limited, as long as it is one obtained by a known production method such as the Czochralski method (including magnetic field applied MCZ or the like), or a floating zone method. Production by the Czochralski method is preferable.

Figure 9:
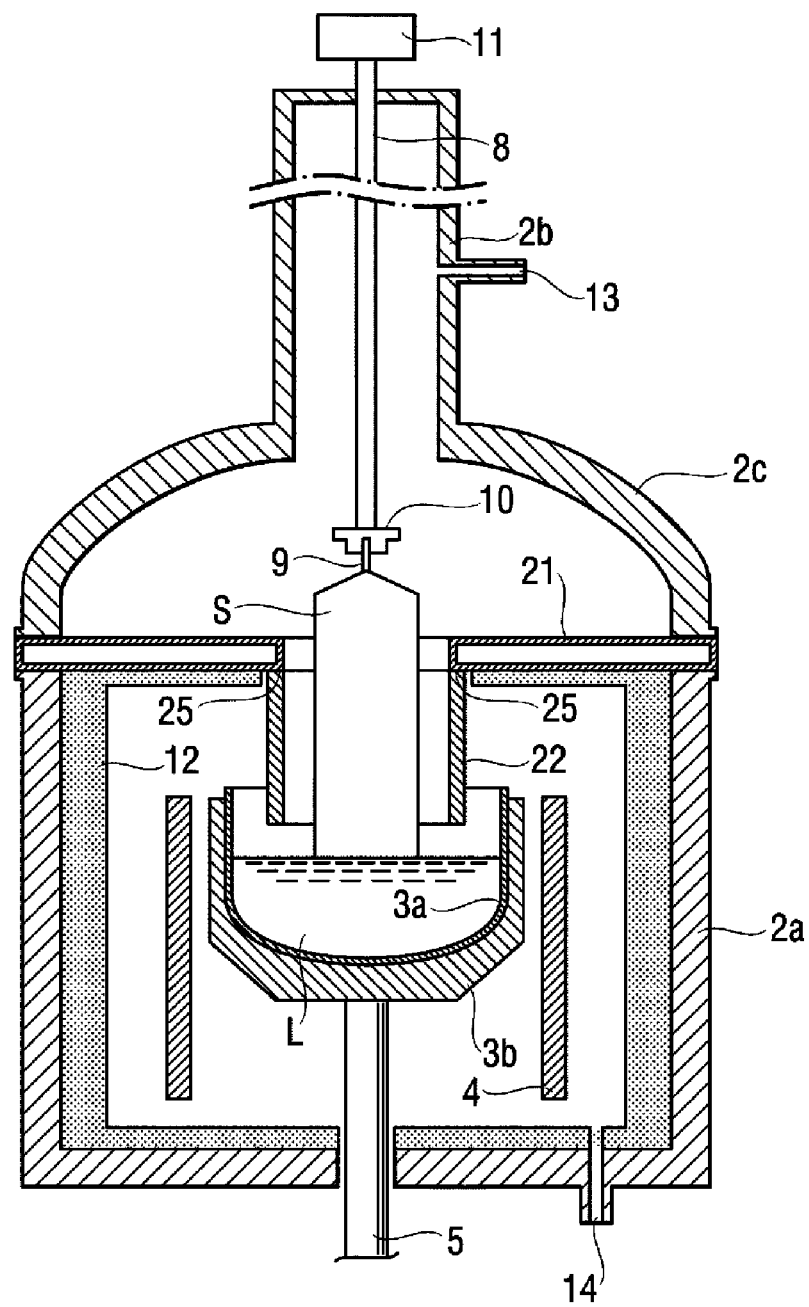
FIG. 9 is an outline cross-sectional view showing an example of a single crystal production apparatus to be used in the present invention.

Explanation will be given below on one example of preferable embodiments of the production method for both the silicon crystal and the silicon wafer using a single silicon crystal production apparatus, with reference to examples, along with explanation on the relevant single crystal silicon production apparatus. FIG. 9 is a schematic cross-sectional view showing one example of a single crystal production apparatus to be used in the present invention. The single crystal production apparatus shown in FIG. 9 has a member for melting a semiconductor material and a mechanism for pulling up a grown single crystal; the member for melting a semiconductor material is held inside a heating chamber 2a; and the mechanism for pulling up the single crystal is equipped at the inside and the outside of a pull-up chamber 2b, which constitutes a part of an upper structure separable from this heating chamber 2a. This upper structure has an intermediate chamber 2c as well.

Inside the heating chamber 2a, a crucible retaining molten liquid L is equipped with a rotation shaft 5, and this crucible is supported in a free rotation and free hoisting state. The rotation shaft 5 is rotated and hoisted by a drive unit not shown. The drive unit ascends the crucible by an amount corresponding to the lowered liquid surface to compensate lowering of the liquid surface accompanying with pulling up a single crystal S, and in order to stir the molten liquid L, the unit rotates the crucible in a predetermined rotation rate. The crucible is constituted by a quartz crucible 3a, and a graphite crucible 3b protecting the quartz crucible. At the side wall of the crucible, a heater 4 for melting the silicon is arranged so as to surround its circumference. At the outside of this heater 4, an insulating material 12, to prevent direct radiation of heat from this heater 4 to the heating chamber 2a, is equipped so as to surround its circumference.

At the pull-up chamber 2b, a pull-up wire 8 is provided, which is hung through the top wall of the ceiling of the intermediate chamber 2c and one end thereof is fixed to a wire winder 11; and at the lower end of this pull-up wire 8, a chuck 10 for holding a seed crystal 9 is attached. The wire winder 11 pulls up the single crystal S growing gradually at the bottom of the seed crystal 9, according to the growth speed, and at the same time, rotates the crystal in an opposite direction to a rotation direction of the crucible.

From a gas inlet 13 formed at the holding part for the pull-up chamber 2b, a gas mixture of argon and hydrogen is introduced, and this mixed gas is discharged from a gas vent 14, after circulating inside the heating chamber 2a. The reason for circulating the mixed gas inside the chamber in this way is, as described above, to prevent contamination of $SiO_2$ gas or $CO_2$ gas into the molten silicon liquid, because these gases are generated inside the chamber accompanied with melting of silicon by heating with the heater 4.

Upward of the crucible inside the chamber, a liquid cooling structure 21 and a cooling body 22 are arranged so as to surround the growing single crystal. The liquid cooling structure 21 is a structured body in which a liquid coolant is circulated inside. In FIG. 9, the liquid cooling structure 21 is configured as a water cooling chamber made of stainless steel, using water as the coolant.

The cooling body 22 made of a high thermal conductivity material is arranged so as to cool the growing single crystal S. A material composing the cooling body 22 can be selected from substances with high heat conductivity and heat radiation rate, for example, silver, a silver alloy, carbon, copper or the like. As a material with high heat conductivity, as well as having no concern of contamination of the molten liquid or the single crystal, use of silver or a silver alloy is most preferable. A method for coating gold or silver or an alloy thereof onto the surface of copper or a copper alloy can be adopted as well.

The cooling body 22 is explosively jointed to the liquid cooling structure 21, and forms an explosively jointed part 25. In explosive jointing, materials to be jointed are arranged parallel to each other at a suitable space apart. On one of materials, a suitable amount of an explosive is mounted via a buffer material, and explosion of this one end is initiated with a detonator, to collide both materials with the progress of the explosion, and both metals show viscous fluid-like behavior at the collision point with very high deformation speed and high pressure, generating metal jet flow forward from the collision point. Because an oxidized film or a gas adsorbed layer on the metal surface is removed by this metal jet flow, a clean surface thus appeared is adhered closely by high pressure, and both materials joint completely with a metal structure.

Because the jointed part of the cooling body 22 and the liquid cooling structure 21 is explosively jointed, a good joint part is formed, irrespective of being a joint part of different kind of metals, and further, it is possible to secure nearly 100% of contact ratio in the contact area. Therefore, heat transfer from the cooling body 22 to the liquid cooling structure 21 proceeds extremely well, and it is possible to decrease the temperature of the cooling body 22. The cooling body 22 is arranged at a position to shield radiation heat from the crucible or the molten liquid L to the single crystal S by taking a nearly rotationally symmetrical shape with respect to the center axis of the growing single crystal S, and is jointed with the liquid cooling structure 21 at the upper part of the cooling body 22.

In FIG. 9, the cooling body 22 is shown to have a cylindrical shape, and the contact area of the explosively jointed part 25 of the cooling body 22 and the liquid cooling structure 21 has nearly the same area of cross-section of the main body of the cooling body. As for the surface property of the cooling body 22, by making the inner side of the cooling body 22 facing the single crystal S black, heat radiation can be absorbed. The outer side of the cooling body 22 facing the crucible can be a surface with high reflectance, so as to reflect heat radiation.

The liquid cooling structure 21 is a water cooling chamber having a doughnut-like shape, and is arranged between the side wall of the intermediate chamber 2c and the heating chamber 2a.

Firstly, in producing the single crystal S, the upper structure, having the pull-up chamber 2b, the intermediate chamber 2c and the liquid cooling structure 21 explosively jointed with the cooling body 22, is separated from the heating chamber 2a. Polycrystalline silicon material as a raw material, impurities in trace amounts as dopants (for example phosphorous in the case of an n-type, boron in the case of a p-type, etc., selected as appropriate to obtain a desired semiconductor), and if necessary, a nitrogen-containing substance and a carbon-containing substance are introduced into the crucible, and then the upper structure is attached again to the heating chamber 2a. By turning on the heater 4 in this state, melting of the semiconductor material inside the crucible is achieved. When the semiconductor material is in a molten state, hydrogen is input, if necessary, into the atmosphere inside the crystal pull-up furnace for growing the silicon crystal, and the pull-up wire 8 is descended by actuating the wire winder 11, so that the seed crystal 9 attached to the chuck 10 contacts the surface of the molten liquid L. When the single crystal S starts growing on the seed crystal 9, in this state, by pulling up the wire winder 11 at a predetermined speed, the single crystal S is grown.

The method for adding nitrogen or carbon to the silicon crystal (and thus the silicon substrate wafer cut from the silicon crystal) is not particularly limited, and a conventionally known method is preferably used. More specifically, for adding nitrogen, a silicon substrate having a nitride film may be added to the molten liquid, and the nitrogen concentration of the resultant silicon substrate wafer can be thus adjusted; and for adding carbon, carbon powder may be added to the molten liquid, and thus the carbon concentration of the resultant silicon substrate wafer can be adjusted.

Thus, in the process of growing the single crystal S by pulling from the molten liquid L, radiant heat from the single crystal S irradiates the cooling body 22 made of high thermal conductivity material. Because the cooling body 22 is explosively jointed with the liquid cooling structure 21 cooled by a liquid coolant and kept at low temperature, exchange of radiant heat with the single crystal S is good, and cooling rate of the single crystal S can be enhanced. In addition, because rapid cooling of the single crystal S during pulling is possible, generation of crystal defects in the single crystal S is shapely reduced. A pulled single crystal S of the present invention can thus be obtained. By cutting wafers from the single crystal S, and by polishing (mirror finishing) if necessary, the silicon substrate wafer (or a mirror wafer) of the present invention can be obtained. By subjecting the silicon substrate wafer obtained here to the heat treatment steps (A) to (C) of the present invention, the silicon wafer of the present invention can be produced.

The silicon substrate wafer of the present invention can be prepared as desired, specifically, by suitably controlling single crystal growth conditions (crystal pull rate, crystal cooling rate, crucible rotation, gas flow and the like). In addition, limitations of size (diameter, thickness or the like) of the silicon wafer (or the silicon substrate wafer) of the present invention, and limitations of the presence or absence of dopants of various elements are not especially required, and these can be selected as appropriate in response to the kind and performance of the silicon wafer required.

"Silicon substrate wafer" in the present description means the silicon wafer before the heat treatment steps (A) to (C) of the present invention, including wafers subjected to a step other than the heat treatment such as chamfering as appropriate after cutting the wafer from the silicon crystal of the present invention. "Silicon wafer" in the present description means wafers after performing the heat treatment steps of the present invention.

The Heat Treatment Step (A)

The heat treatment step (A) of the present invention comprises the steps of: inserting the silicon substrate wafer into a heat treatment furnace set at temperature of 700° C. to 800° C.; increasing the temperature at a rate of 5° C./minute to 10° C./minute over a range of the insertion temperature of the silicon substrate wafer to a temperature of below 1100° C.; increasing the temperature at a rate of 1° C./minute to 2° C./minute over the temperature range of from 1100° C. to 1250° C.; keeping the temperature preferably constant, and between 1200° C. to 1250° C. for from 2 to 4 hours; decreasing the temperature of the heat treatment furnace at a rate of 1° C./minute to 10° C./minute; removing the silicon substrate wafer from the heat treatment furnace at a temperature of 700° C. to 800° C.; and cooling the silicon substrate wafer down to room temperature.

As for effect of the step (A) on the morphology of BMDs, this is understood as follows. Usually, after growth of the silicon crystal, in cooling the crystal to room temperature, oxygen, point defects, and other elements in the silicon crystal aggregate to form micro BMD nuclei, which exist in the silicon substrate wafer. By subjecting the silicon substrate wafer to heat treatment, oxygen aggregates around these BMD nuclei to form BMDs with observable size. BMDs formed in such a process tend to have a morphology accompanying the {111} plane. On the other hand, in the case where the silicon substrate wafer is subjected to heat treatment at higher than or equal to 1200° C., such as the heat treatment step (A), the micro BMD nuclei dissolve. After that, it is understood that by forming the BMD nuclei again in the heat treatment step (B), and growing them in the heat treatment step (C), along with the effect of carbon or hydrogen to be described later, it is difficult to form BMDs which accompany the {111} plane.

In the step A, when inserting the silicon substrate wafer inside the furnace at below 700° C., a decrease in life time of the furnace heater is incurred, and thus is not preferable, while a temperature of over 800° C. deteriorates furnace members and thus it is also not preferable.

The reason for setting the rate of temperature increase from 5° C./minute to 10° C./minute for the range of the insertion temperature of the silicon substrate wafer to a temperature of below 1100° C., and a rate of temperature increase from 1° C./minute to 2° C./minute over the temperature range of 1100° C. to 1250° C. is that such rates can be attained by a general heat treatment furnace, and shortens total heat treatment time.

In the step for keeping the wafer at a constant temperature, the reason for setting the temperature higher than or equal to 1200° C. or the time equal to or longer than 2 hours is because these allow the ratio of the {111} plane of BMDs to less than or equal to 0.3, and suppress warpage to equal to less than 10 µm, after completion of the high temperature heat treatment step of the heat treatment step (C).

A temperature of the heat treatment furnace of over 1250° C. causes severe deterioration of an annealing furnace member, and thus it is not preferable, while the time for keeping at a constant temperature of over 4 hours is not preferable due to decrease in productivity. The rate of temperature decrease is preferably from 1° C./minute to 10° C./minute, which can be attained by a general furnace. A furnace temperature of below 700° C., when taking out the substrate to the outside of the furnace incurs a decrease in life time of the furnace heater, and thus it is not preferable, while a temperature of over 800° C. deteriorates the furnace members, and thus it is also not preferable.

The Heat Treatment Step (B)

The heat treatment step (B) of the present invention comprises the steps of: inserting the silicon substrate wafer into a heat treatment furnace at a temperature of 700° C. to 800° C.; performing a heat treatment at a preferably constant temperature between 700° C. to 800° C. for 30 minutes to 5 hours; increasing the temperature at a rate of 0.5° C./minute to 2° C./minute, up to a temperature in which +50° C. or more is added to the constant temperature; decreasing the temperature of the heat treatment furnace at a rate of 1° C./minute to 10° C./minute; removing the silicon substrate wafer from the furnace at a temperature of 700° C. to 800° C.; and cooling the substrate down to room temperature.

By performing the relevant heat treatment step (B), the micro BMD nuclei dissolved previously in the heat treatment step (A) can be formed again. In the heat treatment step (B), a heat treatment furnace temperature of below 700° C. does not provide BMD formation sufficiently because of insufficient diffusion of oxygen, and thus is not preferable, while even when the temperature is over 800° C., there is little influence on BMD optimization, and thus this is not preferable.

A time of heat treatment of below 30 minutes, performed at a constant temperature of from 700° C. to 800° C., is insufficient for formation of BMD nuclei, while a time of over 5 hours decreases productivity extremely, and thus it is not preferable.

Further, the rate of temperature increase of a low rate below 0.5° C./minute cannot secure a stable rate of temperature increase, while the rate of over 2° C./minute could destroy BMDs deposited, and thus it is not preferable. When the final temperature of the temperature increasing step is below a temperature which is +50° C. or more higher than the constant temperature of the low temperature heat treatment step, the BMDs, which were formed during temperature increase, vanish in the next step C, and thus this is not preferable.

The Heat Treatment Step (C)

The heat treatment step (C) of the present invention comprises the steps of: inserting the silicon substrate wafer into a heat treatment furnace set at a temperature of 700° C. to 800° C.; increasing the temperature at a rate of 5° C./minute to 10° C./minute over the range of the insertion temperature of the silicon substrate wafer to a temperature of below 1100° C.;

increasing the temperature at a rate of 1° C./minute to 2° C./minute over a temperature range of 1100° C. to 1250° C.; keeping the temperature preferably constant, and between 1200° C. to 1250° C. for from 1 to 4 hours; decreasing the temperature of the heat treatment furnace at a rate of 1° C./minute to 10° C./minute; and removing the silicon substrate wafer from the heat treatment furnace at a temperature of from 700° C. to 800° C.

By performing the heat treatment step (C), BMD nuclei, which are difficult to accompany the {111} plane, can be grown.

It is considered that in the heat treatment step (C), by setting the temperature at higher than or equal to 1200° C., or the retention time at equal to or longer than 1 hour, it is possible to attain a diagonal length of BMD of equal to or longer than 10 nm by growth of the BMD nuclei, and as a result, slip after the heat treatment can be suppressed to equal to or less than 10 μm by the slip shielding effect.

It is considered that by subjecting the silicon substrate wafer to the heat treatment, which includes these heat treatment steps (A) to (C) as an inseparable set, BMDs which are difficult to accommodate with the {111} plane are formed, and as a result, generation of slip and warpage in the device production process can both be extremely suppressed.

The atmosphere of the heat treatment steps (A) to (C) is not particularly limited, and they may be performed under a nitrogen atmosphere, hydrogen atmosphere, oxygen atmosphere, or rare gas (Ar or the like) atmosphere; and there is no limitation on the apparatus to be used in the heat treatment steps (A) to (C), and a conventionally known apparatus is preferably used. Specifically, a usual batch-system vertical-type furnace, a batch-system vertical-type furnace having RTA (rapid thermal treatment) or oxygen purging function etc. are included.

As for the production method for the silicon wafer of the present invention, it is preferable that the silicon substrate wafer of the present invention contains nitrogen. This is because by containing nitrogen in the substrate, warpage can be further suppressed to a small level (typically, equal to or smaller than 5 μm). Thus, by further suppressing warpage, a higher performance device can be produced.

The nitrogen concentration inside the silicon substrate wafer of the present invention is preferably $1.5 \times 10^{14}$ atoms/cm$^3$ to $5 \times 10^{15}$ atoms/cm$^3$, and more preferably $4 \times 10^{14}$ atoms/cm$^3$ to $5 \times 10^{15}$ atoms/cm$^3$. The nitrogen concentration of below the above range causes surface defects after high temperature heat treatment to remain, and thus it is not preferable, while a nitrogen concentration of over the above range generates polycrystallization and could decrease yield, and thus is also not preferable.

In the production method for the silicon wafer of the present invention, it is preferable that the silicon substrate wafer of the present invention contains carbon. Carbon concentration is preferably from $3 \times 10^{15}$ atoms/cm$^3$ to $2 \times 10^{17}$ atoms/cm$^3$, and more preferably from $5 \times 10^{15}$ atoms/cm$^3$ to $1 \times 10^{17}$ atoms/cm$^3$. A carbon concentration below the above range makes the ratio of the {111} plane of BMD after completion of the high temperature heat treatment step (C) be over 0.3, and thus is not preferable, while a carbon concentration of over the above range generates polycrystallization and could decrease yield, and thus is also not preferable.

In the production method for the silicon wafer of the present invention, it is preferable that oxygen concentration of the silicon substrate wafer is preferably from $8 \times 10^{17}$ atoms/cm$^3$ to $9 \times 10^{17}$ atoms/cm$^3$. An oxygen concentration below the above range causes BMD density to be below $1 \times 10^{11}$/cm$^3$, and thus is not preferable, while an oxygen concentration over the above range could decrease yield of the crystal, and thus is also not preferable.

In the production method for the silicon wafer of the present invention, it is preferable that the hydrogen partial pressure inside the crystal pulling furnace when pulling the silicon crystal is 3 to 40 Pa, and more preferably 30 to 40 Pa. Setting the hydrogen partial pressure to 3 to 40 Pa can make the ratio of the {111} plane of BMD to be less than or equal to 0.3, because of the addition of a constant amount of hydrogen into the crystal along with carbon. The case where the hydrogen partial pressure inside the silicon crystal pull-up furnace is below 3 Pa or over 40 Pa decreases the yield of the crystal, and thus it is not preferable.

It is further preferable that for the silicon crystal of the present invention, nitrogen and carbon are doped in the silicon melt liquid, and the silicon crystal is grown under a gas atmosphere including hydrogen inside the silicon crystal pulling furnace. It is further preferable that the hydrogen partial pressure inside the crystal pull-up furnace for growing the silicon crystal is 3 to 40 Pa, the nitrogen concentration is $4 \times 10^{14}$ to $5 \times 10^{15}$ atoms/cm$^3$ and the carbon concentration is $5 \times 10^{15}$ to $1 \times 10^{17}$ atoms/cm$^3$.

In the production method of the present invention, it is preferable that the cooling rate in pulling the silicon crystal over the range of 1000° C. to 900° C. is higher than or equal to 5° C./minute. A cooling rate below the above value provides a ratio of the {111} plane of BMD of over 0.3, after completion of the heat treatment step (C), and thus it is not preferable.

Carbon concentration, nitrogen concentration and oxygen concentration in the silicon crystal, and carbon concentration, nitrogen concentration and oxygen concentration in the resultant silicon wafer are substantially the same.

As the silicon crystal of the present invention, it is most preferable that by setting the hydrogen partial pressure inside the crystal pulling furnace at from 3 to 40 Pa and controlling the cooling rate of said silicon crystal at 1000° C. to 900° C. to be higher than or equal to 5° C./minute, the nitrogen concentration of the silicon substrate wafer obtained from the silicon crystal is from $1.5 \times 10^{14}$ atoms/cm$^3$ to $5 \times 10^{15}$ atoms/cm$^3$; oxygen concentration is from $8 \times 10^{17}$ atoms/cm$^3$ to $9 \times 10^{17}$ atoms/cm$^3$; and carbon concentration is $3 \times 10^{15}$ atoms/cm$^3$ to $2 \times 10^{17}$ atoms/cm$^3$ (as converted by JEITA).

The silicon wafer of the present invention shows a synergistic effect, by doping nitrogen and carbon in the silicon molten liquid as above, and also by using the silicon substrate wafer grown under a gas atmosphere including hydrogen inside the silicon crystal pulling furnace, in addition to the heat treatment steps (A) to (C), which suppresses and prevents generation of slip and warpage, and generation of slip dislocation in device production processes.

Measurement methods for concentrations of nitrogen, carbon and oxygen included in the silicon substrate wafer and the silicon wafer of the present invention are not particularly limited, and can be measured by conventionally known methods. More specifically, as a method for measuring nitrogen concentration, secondary ion mass spectrometer (SIMS) can be used. As a method for measuring oxygen and carbon concentrations, these concentrations can be measured by using an infrared absorption method, and determined by values of JEITA (Japan Electronics and Information Technology Industries Association) as a conversion factor.

EXAMPLES

Explanation will be given below on Examples of the present invention. However, the present invention should not be limited to the following Examples. That is, the following Examples are merely exemplifications, and any one should be encompassed in a technological scope of the present invention, as long as it has technological concept and substantially same constitution and exerts similar action effect as described in the claims of the present invention.

Example 1

Pulling of a single crystal silicon was performed using a silicon crystal production apparatus. The silicon crystal production apparatus used in the present Example is a single crystal production apparatus having the cooling body 22, shown in FIG. 9. Such an apparatus is used in a silicon crystal production by the usual CZ method, and crucible diameter used in the apparatus was 22 inch, silicon semiconductor material introduced into the crucible was 100 kg, and the single crystal S grown was an 8 inch (200 mm) crystal.

Silver was used as the material of the cooling body 22, and the inner diameter of the cooling body 22 was 260 mm, the outer diameter thereof was 300 mm, and the length was 280 mm. As the liquid cooling structure 21, a configuration was used such that the liquid cooling structure 31 was set as a doughnut-shaped water cooling chamber having a cooling water pipeline inside and attached to the lower part of the intermediate chamber 2c.

Specifically, the relevant production apparatus is a pulling furnace 1 where a heat shielding body 36 was cooled by the above method for increasing pulling speed to greater than or equal to 1100° C.; or a pulling furnace 2 having a general pulling rate. In the pulling furnace 1, the jointed part of the cooling body 22 and the liquid cooling structure 21 was explosively jointed. On the other hand, in the pulling furnace 2, the jointed part of the cooling body 22 and the liquid cooling structure 21 was bolt jointed.

The pulling furnace 1 was used to attain a cooling rate of 5° C./minute at 900° C. to 1000° C., and the pull-up furnace 2 was used to attain 2° C./minute.

The silicon crystal grown by utilizing this apparatus was p-type (boron doped-type) of a conduction-type, and crystal size (diameter) was 200 mm (8 inch).

The addition of nitrogen was performed by adding a wafer having a nitride film into the silicon molten liquid. The addition of carbon was performed by adding carbon powder into the silicon molten liquid. Nitrogen concentration of the silicon wafer obtained by slicing the crystal was measured by using a secondary ion mass spectrometer (SIMS). Oxygen and carbon concentrations were measured by an infrared light absorption method, using value of JEITA (Japan Electronics and Information Technology Industries Association). That is, the conversion factor of inter-lattice oxygen concentration is $3.03 \times 10^{17}/cm^2$, and the conversion factor of carbon concentration is $8.1 \times 10^{16}/cm^2$.

The wafer having a nitrogen concentration of less than or equal to $5 \times 10^{14}$ atoms/cm$^3$ cannot be measured by using SIMS, therefore nitrogen concentration determined by the following expression was used. Explanation will be given below in detail on such an expression.

The method for adding nitrogen in the production method of the present invention is not particularly limited, and known methods can be used, these include for example, a method for introducing nitrogen gas during dissolving a silicon raw material; a method for mixing a silicon substrate deposited with a nitride by a CVD method or the like, during dissolving a raw material. The segregation coefficient k, which is the ratio of impurities taken in the crystal after solidification of the silicon molten liquid relative to the concentration in the molten liquid, is $7 \times 10^{-4}$ in the case of nitrogen (W. Zulehner and D. Huber, Crystal Growth, Properties and Applications, p 28, Springer-Verlag, New York, 1982).

Nitrogen concentration taken into the crystal from the silicon molten liquid to be used in the production method of the present invention is calculated as follows:

Nitrogen concentration in the wafer=$k \times (1-$solidification rate$)^{(k-1)} \times$nitrogen concentration in the molten liquid     Expression 1

Nitrogen concentration in the molten liquid may also be called as initial nitrogen concentration in the molten liquid. Here, solidification rate (g) of the silicon crystal is determined as follows:

Solidification rate ($g$) of the silicon crystal=(weight of silicon crystallized)/(initial molten liquid weight)     Expression 2

Measurement values [atoms/cm$^3$] of nitrogen concentration are described in the following Table 1.

The addition of hydrogen was performed by introducing hydrogen mixed gas to each of the pulling furnaces. As the hydrogen partial pressure [Pa], conditions described in the following Table 1 were set.

Figure 8:
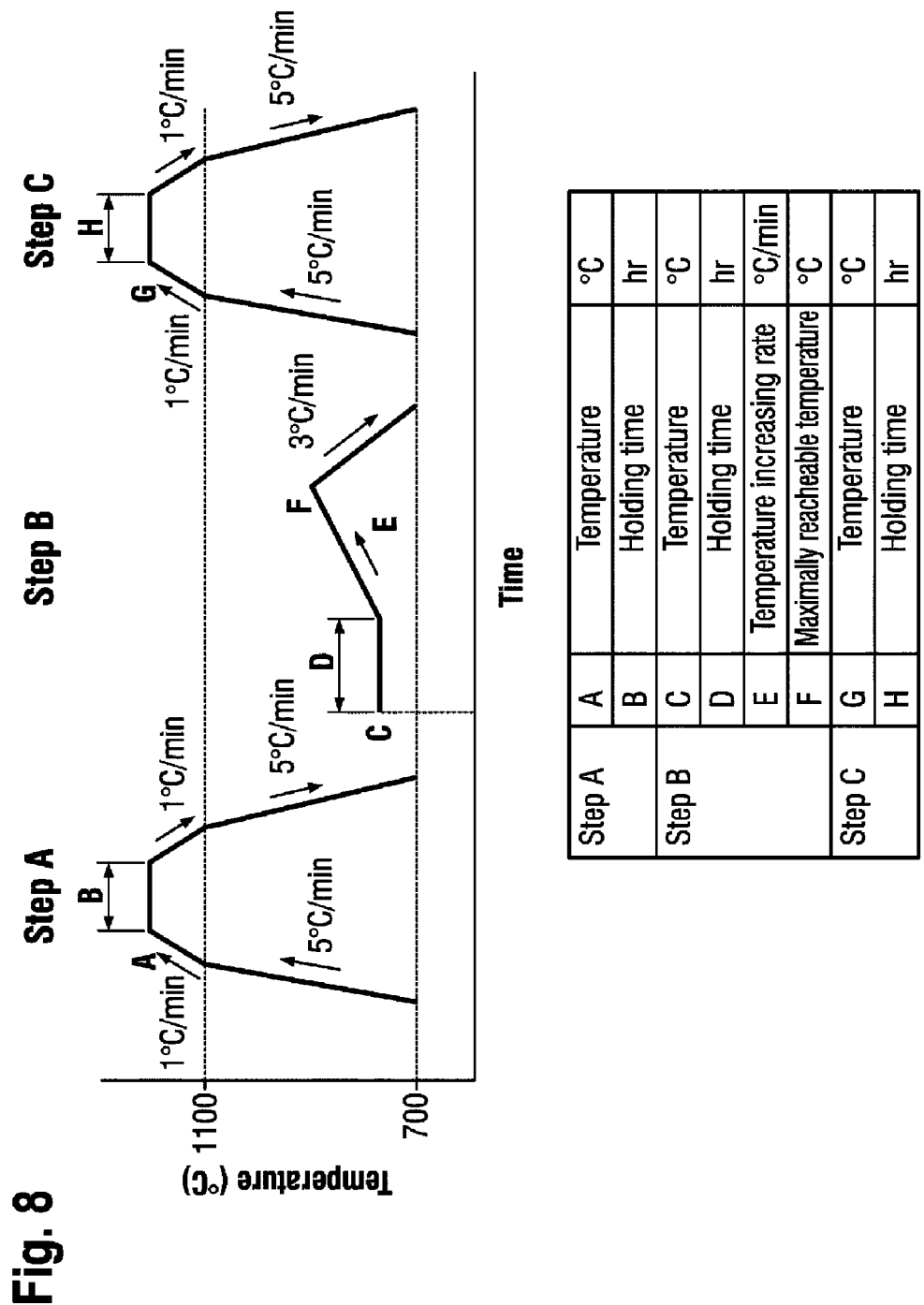
FIG. 8 is a graph of a change of heat treatment temperature relative to time in the production method of the present invention.

In this way, a plurality pieces of substrates were cut out from the same site of this single crystal using a wire saw, then, they were subjected to mirror finishing to obtain the silicon substrate wafer (a thickness of about 725 µm). Thereafter, the relevant silicon wafer was used as a substrate to prepare the annealed wafer, by performing heat treatment according to a heat treatment pattern shown in FIG. 8. Heat treatment was performed under atmosphere of 100% argon.

Examples 2, 3 and 4

Silicon wafers were produced in the same way as in Example 1, under conditions shown in the following Table 1. Measurement and Evaluation of the Annealed Wafer On each of the annealed wafers obtained under the preparation conditions, the following measurement and evaluation were performed.

(1) Measurement of BMD Density

A TEM sample was taken from position at a depth of 100 µm from the surface of the annealed wafer. The TEM sample was observed with TEM to count BMDs having a diagonal length of equal to or longer than 10 nm, for at least 10 or more pieces. Volume of the observed region was calculated from total area observed with TEM and sample thickness, and volume density of BMD was calculated from BMD count number and volume of the observed region.

(2) Morphology of BMD

A TEM sample was taken from position at a depth of 100 µm from the surface of the annealed wafer. The TEM sample was observed from the <110> direction to determine the ratio of the {111} plane of BMD, according to the method of FIG. 7. At least 10 BMDs were observed to determine an average value of the ratio of the {111} plane.

(3) Slip Length

The annealed wafer was subjected to the following heat treatment using RTA. The heat treatment under the following condition was repeated 10 times.

Insertion: room temperature
Temperature increasing rate: 50° C./minute
Retention: 1100° C. for 1 minute
Temperature decreasing rate: 30° C./minute
Removal: room temperature
Atmosphere: argon The annealed wafer after the heat treatment was observed by X-ray topography, and the maximal length among slip lengths observed was adopted as a representative value.

(4) Amount of Warpage

The annealed wafer was subjected to the following heat treatment, as the assumption of a device process.

(A) Heat Treatment

780° C., 3 hours+1000° C., 16 hours, dry oxygen atmosphere (B) Deposition of an Oxidized Film
950° C., dry oxygen atmosphere, a film thickness of 15 nm
(C) Deposition of a Nitride Film
CVD, 780° C., a film thickness of 150 nm
(D) Heat Treatment by RTA
Heat treatment under the following condition was repeated 10 times.
Insertion: room temperature
Temperature increasing rate: 50° C./minute
Retention: 900° C. for 1 minute
Temperature decreasing rate: 30° C./minute
Removal: room temperature
Atmosphere: argon Warpage of each of the annealed wafers, before the pseudo device heat treatment and after the pseudo device process heat treatment, was measured using FT-90A, manufactured by NIDEK Co., Ltd., to determine the increased amount of warpage=warpage after heat treatment−warpage before heat treatment.
Each of Measurement Results and Evaluation Results of the Annealed Wafers In Table 1, on annealed wafers prepared under preparation conditions shown in Table 1, as Examples and Comparative Examples, density and inter-lattice oxygen concentration of BMDs having predetermined size measured, and slip and warpage amount, generated by the pseudo device process heat treatment, are summarized.

Rather, the words used in the specification are words of description rather than limitation, and it is understood that various changes may be made without departing from the spirit and scope of the invention.

What is claimed is:

1. A silicon wafer comprising BMDs with a diagonal length of 10 nm to 50 nm, the diagonal length being the length in a <100> direction in a plane image of a BMD projected orthogonally to any one of the {110} planes, wherein a density of said BMDs at a depth position equal to or deeper than 50 μm from a surface of the silicon wafer is greater than or equal to $1 \times 10^{11}/cm^3$, and a ratio of {111} plane in total planes surrounding the BMDs is less than or equal to 0.3, wherein the ratio is determined as the ratio of length of the {111} plane to total length of the circumference, when a BMD is projected in a <110> direction,
   wherein the silicon wafer has a nitrogen concentration of $1.5 \times 10^{14}$ to $5 \times 10^{15}$ atoms/cm$^3$, a carbon concentration of $3 \times 10^{15}$ to $2 \times 10^{17}$ atoms/cm$^3$, and an oxygen concentration of $8 \times 10^{17}$ to $9 \times 10^{17}$ atoms/cm$^3$, and
   wherein the silicon wafer is derived from a silicon single crystal pulled from a crystal pulling furnace.

2. A method for producing a silicon wafer of claim 1, comprising pulling a silicon crystal in a crystal pulling furnace;
   setting the partial pressure of hydrogen inside the crystal pulling furnace to 3 to 40 Pa and

TABLE 1

| No. | H$_2$ partial pressure (Pa) | Cooling rate of 900 to 1000° C. (° C./min) | O$_2$ (atoms/cm$^3$) | N$_2$ (atoms/cm$^3$) | Carbon (atoms/cm$^3$) | Step A A (° C.) | Step A B (hr) | Step B C (° C.) | Step B D (hr) | Step B E (° C./min) | Step C F (° C.) | Step C G (° C.) | Step C H (hr) | BMD density | {111} plane ratio | Slip (mm) | Warpage (μm) |
|---|---|---|---|---|---|---|---|---|---|---|---|---|---|---|---|---|---|
| Example 1 | 3 | 5 | 8.5E+17 | 1.0E+15 | 5.0E+15 | 1200 | 4 | 700 | 4 | 0.5 | 750 | 1200 | 1 | 1.3E+12 | 0.03 | 7 | 0.0 |
| Example 2 | 40 | 5 | 8.3E+17 | 4.0E+14 | 7.0E+16 | 1200 | 4 | 700 | 4 | 0.5 | 750 | 1200 | 1 | 8.9E+12 | 0.10 | 5 | 0.2 |
| Example 3 | 40 | 5 | 8.5E+17 | 2.0E+14 | 1.0E+17 | 1200 | 2 | 700 | 4 | 0.5 | 750 | 1200 | 1 | 6.8E+12 | 0.08 | 3 | 0.5 |
| Example 4 | 40 | 5 | 8.0E+17 | 2.0E+14 | 1.0E+17 | 1200 | 2 | 700 | 4 | 0.5 | 750 | 1200 | 1 | 1.2E+12 | 0.09 | 9 | 0.2 |
| Comparative Example 1 | Non | 5 | 8.5E+17 | 1.0E+15 | 1.0E+17 | 1200 | 4 | 700 | 4 | 0.5 | 750 | 1200 | 1 | 3.4E+12 | 0.32 | 6 | 11.0 |
| Comparative Example 2 | 40 | 2 | 8.3E+17 | 1.0E+15 | 5.0E+15 | 1200 | 4 | 700 | 4 | 0.5 | 750 | 1200 | 1 | 1.2E+12 | 0.40 | 5 | 37.4 |
| Comparative Example 3 | 40 | 5 | 8.8E+17 | 1.0E+15 | Non | 1200 | 4 | 700 | 4 | 0.5 | 750 | 1200 | 1 | 5.6E+11 | 0.58 | 8 | 75.3 |
| Comparative Example 4 | 40 | 5 | 8.4E+17 | 1.0E+15 | 5.0E+15 | Non | | 700 | 4 | 0.5 | 750 | 1200 | 1 | 6.2E+12 | 0.49 | 7 | 111.5 |
| Comparative Example 5 | 40 | 5 | 8.9E+17 | 1.5E+15 | 6.8E+15 | 1200 | 4 | Non | | | | 1200 | 1 | 1.2E+09 | 0.72 | 34 | 0.0 |

While embodiments of the invention have been illustrated and described, it is not intended that these embodiments illustrate and describe all possible forms of the invention.

cooling the silicon crystal at a rate greater than or equal to 5° C./minute over the temperature range of 1000° C. to 900° C.;

obtaining a silicon substrate wafer from the silicon crystal, wherein an oxygen concentration of the silicon substrate wafer is from $8\times10^{17}$ atoms/cm$^3$ to $9\times10^{17}$ atoms/cm$^3$;

a carbon concentration of the silicon substrate wafer is from $3\times10^{15}$ atoms/cm$^3$ to $2\times10^{17}$ atoms/cm$^3$; and a nitrogen concentration of the silicon substrate wafer is from $1.5\times10^{14}$ atoms/cm$^3$ to $5\times10^{15}$ atoms/cm$^3$;

the method further comprising the steps of subjecting the silicon substrate wafer to heat treatment step (A), heat treatment step (B) and heat treatment step (C), in that order:

(A) inserting the silicon substrate wafer into a heat treatment furnace set at temperature of 700° C. to 800° C.;

increasing the temperature at a rate of 5° C./minute to 10° C./minute over the range of the insertion temperature of the silicon substrate wafer to a temperature of below 1100° C.;

increasing the temperature at a rate of 1° C./minute to 2° C./minute over the temperature range of 1100° C. to 1250° C.;

keeping the temperature within the temperature range of 1200° C. to 1250° C. for from 2 to 4 hours;

decreasing the temperature of the heat treatment furnace at a temperature decreasing rate of 1° C./minute to 10° C./minute;

removing the silicon substrate wafer from the heat treatment furnace at a temperature of 700° C. to 800°; and cooling said silicon substrate wafer down to room temperature;

(B) inserting the silicon substrate wafer treated by step (A) into a heat treatment furnace set at a temperature of at from 700° C. to 800° C.;

performing a holding heat treatment at a temperature of 700° C. to 800° C. for 30 minutes to 5 hours;

increasing the temperature at a rate of 0.5° C./minute to 2° C./minute up to a temperature which is higher by 50° C. or more than the holding temperature;

decreasing the temperature of the heat treatment furnace at a rate of 1° C./minute to 10° C./minute;

removing the silicon substrate wafer from the furnace at a temperature of 700° C. to 800° C.; and cooling the substrate down to room temperature;

(C) inserting the silicon substrate wafer treated by step (B) to a heat treatment furnace set at a temperature of at 700° C. to 800° C.;

increasing the temperature at a rate of 5° C./minute to 10° C./minute over the range of the insertion temperature of the silicon substrate wafer to a temperature of below 1100° C.;

increasing the temperature at a rate of 1° C./minute to 2° C./minute over the temperature range of from 1100° C. to 1250° C.;

maintaining the temperature at temperature of 1200° C. to 1250° C. for from 1 to 4 hours;

decreasing the temperature of the heat treatment furnace at a rate of 1° C./minute to 10° C./minute; and removing the silicon substrate wafer from the heat treatment furnace at a temperature of from 700° C. to 800° C.

* * * * *